United States Patent
Cader et al.

(10) Patent No.: US 10,455,726 B2
(45) Date of Patent: Oct. 22, 2019

(54) MODULAR COOLING

(71) Applicant: HEWLETT PACKARD ENTERPRISE DEVELOPMENT LP, Houston, TX (US)

(72) Inventors: Tahir Cader, Liberty Lake, WA (US); John P Franz, Houston, TX (US); David Allen Moore, Tomball, TX (US); Douglas Kent Garday, Mesa, AZ (US); Wade D Vinson, Magnolia, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/511,983

(22) PCT Filed: Sep. 30, 2014

(86) PCT No.: PCT/US2014/058205
§ 371 (c)(1),
(2) Date: Mar. 16, 2017

(87) PCT Pub. No.: WO2016/053273
PCT Pub. Date: Apr. 7, 2016

(65) Prior Publication Data
US 2017/0295667 A1    Oct. 12, 2017

(51) Int. Cl.
*H05K 7/20* (2006.01)
*G06F 1/20* (2006.01)

(52) U.S. Cl.
CPC .......... *H05K 7/20136* (2013.01); *G06F 1/20* (2013.01); *H05K 7/2079* (2013.01);
(Continued)

(58) Field of Classification Search
CPC .............. G06F 1/181–182; G06F 1/20; H05K 7/20218–20381; H05K 7/20409–20418;
(Continued)

(56) References Cited

U.S. PATENT DOCUMENTS 8,031,468 B2    10/2011  Bean, Jr. et al.
8,120,300 B2 *   2/2012  Dishman ................. G06F 1/206
                                                    318/471
(Continued)

FOREIGN PATENT DOCUMENTS

JP           2013003636           1/2013

OTHER PUBLICATIONS

AST Modular; Natural Free Cooling, Secure and Ultra Energy Efficient Indirect Free Cooling; www.astmodular.com/solutions/product/natural-free-cooling_9 ; Copyright © 2015 AST Modular Privacy Policy Sustainability Report.
(Continued)

*Primary Examiner* — Anthony M Haughton
*Assistant Examiner* — Razmeen Gafur
(74) *Attorney, Agent, or Firm* — Hewlett Packard Enterprise Patent Department (57) ABSTRACT

A connection assembly is provided herein. The connection assembly includes a liquid connection and an air connection. The liquid connection is positioned in a first location to receive a liquid cooling system. The air connection is positioned in a second location to receive an air cooling system. The liquid connection and the air connection to provide the interface between an electronic system and the liquid cooling system and the electronic system and the air cooling system, wherein the interface is independent of the liquid cooling system and the air cooling system.

15 Claims, 5 Drawing Sheets

(52) U.S. Cl.
CPC ..... *H05K 7/20254* (2013.01); *H05K 7/20736* (2013.01); *H05K 7/20745* (2013.01); *H05K 7/20781* (2013.01)

(58) Field of Classification Search
CPC ........... H05K 7/20009–7/202; H05K 7/20136; H05K 7/20254; H05K 7/20736; H05K 7/20745; H05K 7/20781; H05K 7/2079; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 8,270,154 | B2 | 9/2012 | Anderson et al. | |
| 8,583,290 | B2 | 11/2013 | Campbell et al. | |
| 8,913,384 | B2* | 12/2014 | David | H05K 13/00 361/679.53 |
| 2004/0221604 | A1* | 11/2004 | Ota | H05K 7/20781 62/259.2 |
| 2004/0264124 | A1* | 12/2004 | Patel | G06F 1/20 361/679.46 |
| 2005/0141200 | A1* | 6/2005 | Campini | H01L 23/3677 361/704 |
| 2005/0180105 | A1* | 8/2005 | Matsushima | G06F 1/20 361/699 |
| 2005/0241803 | A1* | 11/2005 | Malone | G06F 1/20 165/80.4 |
| 2005/0248922 | A1* | 11/2005 | Chu | H05K 7/20727 361/700 |
| 2006/0161311 | A1* | 7/2006 | Vinson | G05D 23/19 700/300 |
| 2006/0227504 | A1* | 10/2006 | Chen | H01L 23/467 361/679.47 |
| 2008/0043433 | A1* | 2/2008 | Joshi | H01L 23/467 361/696 |
| 2008/0198549 | A1* | 8/2008 | Rasmussen | H05K 7/2079 361/696 |
| 2008/0209931 | A1* | 9/2008 | Stevens | F28D 15/0275 361/699 |
| 2008/0218980 | A1* | 9/2008 | Tracewell | H05K 7/20672 361/713 |
| 2009/0154104 | A1* | 6/2009 | Kondo | G06F 1/20 361/700 |
| 2010/0073866 | A1* | 3/2010 | Toyoda | F28D 15/043 361/679.47 |
| 2010/0164427 | A1* | 7/2010 | Dishman | G06F 1/206 318/705 |
| 2011/0013359 | A1* | 1/2011 | Goldrian | G06F 1/20 361/679.54 |
| 2011/0016893 | A1* | 1/2011 | Dawes | F25B 49/02 62/89 |
| 2011/0279976 | A1* | 11/2011 | Mikami | G06F 1/20 361/696 |
| 2011/0303394 | A1* | 12/2011 | Branton | H05K 7/20754 165/104.33 |
| 2012/0026691 | A1* | 2/2012 | Campbell | H05K 7/20781 361/700 |
| 2012/0037339 | A1* | 2/2012 | Lipp | F28D 1/05316 165/80.2 |
| 2012/0176745 | A1* | 7/2012 | Helberg | G06F 1/1632 361/679.47 |
| 2012/0247708 | A1* | 10/2012 | Sklenak | H05K 7/20745 165/11.1 |
| 2013/0061624 | A1 | 3/2013 | Zwinkels | |
| 2013/0098599 | A1* | 4/2013 | Busch | H05K 7/20209 165/294 |
| 2013/0205822 | A1* | 8/2013 | Heiland | H05K 7/2079 62/259.2 |
| 2013/0233532 | A1 | 9/2013 | Imwalle et al. | |
| 2013/0333401 | A1 | 12/2013 | Long et al. | |
| 2013/0333414 | A1 | 12/2013 | Inaba | |
| 2014/0029193 | A1 | 1/2014 | Alshinnawi | |
| 2014/0063730 | A1* | 3/2014 | Hay | H05K 7/20745 361/679.46 |
| 2014/0076520 | A1 | 3/2014 | Lu et al. | |
| 2014/0085808 | A1* | 3/2014 | Tung | H05K 7/20736 361/679.47 |
| 2014/0138068 | A1* | 5/2014 | Nienberg | H05K 7/20909 165/121 |
| 2014/0202678 | A1 | 7/2014 | Goth et al. | |
| 2014/0211531 | A1* | 7/2014 | Yamashita | H02M 7/003 363/141 |
| 2014/0301037 | A1* | 10/2014 | Best | H05K 7/20781 361/679.53 |
| 2014/0307384 | A1* | 10/2014 | Best | H05K 7/20781 361/679.53 |
| 2015/0070844 | A1* | 3/2015 | Chang | H05K 7/20636 361/699 |
| 2015/0138722 | A1* | 5/2015 | French, Jr. | G06F 1/20 361/679.47 |
| 2015/0173238 | A1* | 6/2015 | Nakanishi | H02M 7/003 361/709 |
| 2015/0173252 | A1* | 6/2015 | Zeighami | H05K 7/20781 340/606 |
| 2016/0262287 | A1* | 9/2016 | Chester | H05K 7/20772 |
| 2016/0330873 | A1* | 11/2016 | Farshchian | G06F 1/20 |
| 2017/0105313 | A1* | 4/2017 | Shedd | H05K 7/20272 |
| 2017/0150649 | A1* | 5/2017 | Chester | H05K 7/20772 |
| 2017/0181326 | A1* | 6/2017 | Shelnutt | G05D 7/0629 |
| 2017/0196120 | A1* | 7/2017 | Oprins | H05K 5/06 |

OTHER PUBLICATIONS

PCT/ISA/KR, International Search Report, dated Jun. 29, 2015, PCT/US2014/058205.

* cited by examiner

MODULAR COOLING

BACKGROUND

Electronic devices have temperature requirements. Heat from the use of the electronic devices is controlled using cooling systems. Examples of cooling systems include air and liquid cooling. The cooling systems are typically designed to work with the electronic devices and the climate.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs must balance conflicts between power density, spatial layout, temperature requirements, acoustic noise, and other factors. Air cooling systems typically use heat sinks and fans to remove "waste" heat from the system. The use of heat sinks and fans increase the electrical power required to operate an electronic device in an electronic system, and may cause excessive acoustic noise and lower system density. Liquid cooling can be more efficient than air cooling; however, the liquid cooling typically includes plumbing connections within the electronic devices. As the liquid goes through the plumbing connections the risk of leakage of liquid within the electronic device is introduced.

Custom cooling solutions may be configured for cooling electronic systems, such as modular computing facilities. Custom cooling solutions may include air cooling systems and/or liquid cooling systems. The connections used to make the cooling systems work are custom to the design of the facility and typically are not interchangeable or compatible with one another. Custom cooling solutions are not cost effective and do not allow for standardization of equipment or use of off the shelf components. Moreover, the use of custom solutions may complicate installation and/or delay repair times.

In examples, a connection assembly is provided. The connection assembly includes a liquid connection and an air connection. The liquid connection is positioned in a first location to receive a liquid cooling system. The air connection is positioned in a second location to receive an air cooling system. The liquid connection and the air connection to provide the interface between an electronic system and the liquid cooling system and the electronic system and the air cooling system, wherein the interface is independent of the liquid cooling system and the air cooling system The phrase "liquid cooling system" refers to a cooling system to cool an electronic system using liquid. Examples include direct liquid cooling, component level liquid cooling, dry disconnect liquid cooling, an adiabatic liquid cooler, a "dry cooled" liquid device, an externally supplied coolant, a heat exchanger, an externally supplied cooling unit directly connected to electronic components, and a direct expansion liquid cooling device.

The phrase "air cooling system" refers to a cooling system to cool an electronic system using thermal and mechanical means. For example, the air cooling system may include fans, heat sinks, heat exchangers, induction devices, a direct expansion air cooling device, an adiabatic cooled device, an outside air induction device, a facility air cooler device, and a heat exchanger with facility chilled water.

The phrase "independent connection" refers to a connection that is not dependent on the system which is connects to. For example, the connection is generic or standard and may connect to a variety of cooling systems and/or electronic systems to enable interchangeability of components or portions of systems.

The phrase "blind mate connection" refers to connectors that do not require tools to form a connection and include self-aligning features, The term "swappable" refers to interchangeability on components. For example, the term swappable may include components that may be installed and/or replaced with a plurality of components, such as a plurality of cooling components or systems may be used. Examples include hot-pluggable cooling components that may be changed without rebooting a computer system.

Figure 1:
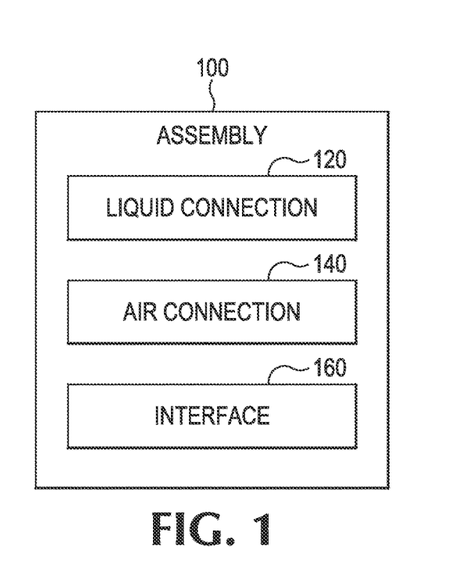
FIG. 1 illustrates a block diagram of a connection assembly according to an example.

FIG. 1 illustrates a block diagram of a connection assembly according to an example. The connection assembly 100 is usable with a modular cooling system. The connection assembly 100 includes a liquid connection 120, an air connection 140, and an interface 160. The liquid connection 120 is positioned in a first location to receive a liquid cooling system. The air connection 140 is positioned in a second location to receive an air cooling system. The liquid connection 120 and the air connection 140 to provide the interface 160 between an electronic system and the liquid cooling system and the electronic system and the air cooling system. The interface 160 is independent of the liquid cooling system and the air cooling system.

Figure 2:
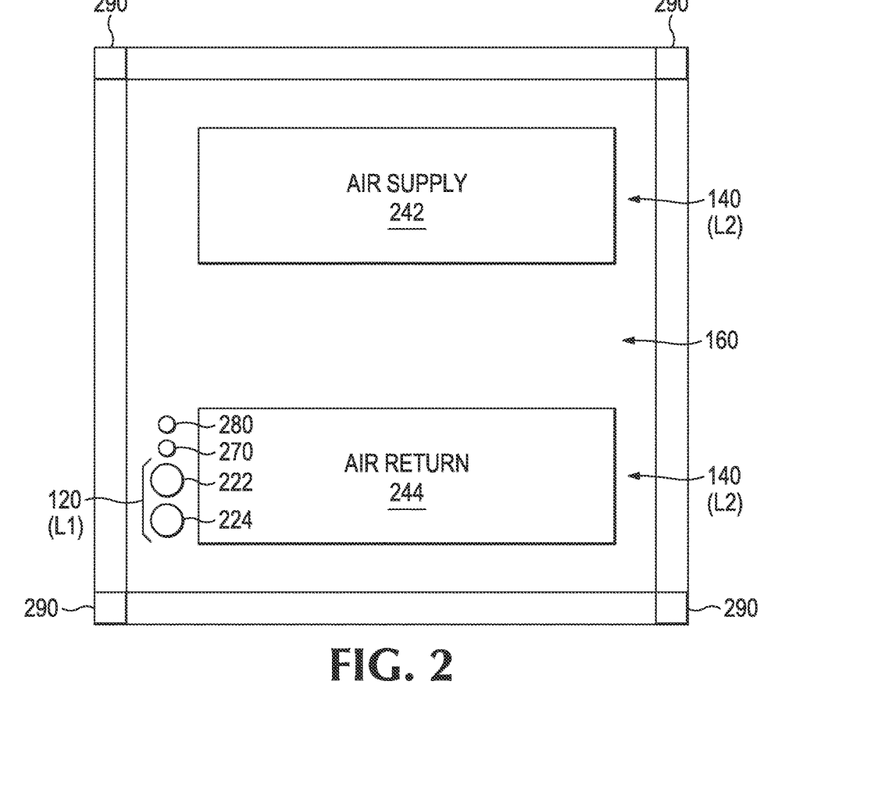
FIG. 2 illustrates a top view of the connection assembly of FIG. 1 according to an example.

FIG. 2 illustrates a top view of the connection assembly 100 of FIG. 1 according to an example. The connection assembly 100 includes the liquid connection 120 and the air connection 140. The liquid connection 120 is illustrated to include, for example, a liquid supply 222 and a liquid return 224 positioned on a first location, L1. The liquid connection 120, such as the liquid supply 222 and the liquid return 224, may include, for example, at least one connector selected from the following connectors a cable, a hose, and a valve. The cable, hose, or valve may further include a pressure monitor to monitor pressure and control the liquid. For example, the valve may be held open by pressure, the pressure differential may provide backflow prevention and control the transfer of liquid between the liquid cooling system and the electronic system. The liquid connection 120 may include a pluggable connection, such as a blind mate connector that provides a hot-pluggable or swappable connection. The liquid connection 120 may further include a liquid tight seal using, for example, a gasket and/or a dripless connector. For example the dripless connector may include a built in shutoff to prevent leakage when the fluid connections are assembled and/or disassembled.

The air connection 140 is illustrated to include, for example, an air supply 242 and an air return 244. The air connection 140, such as an air supply 242 and an air return 244, may include, for example, a tube, a pipe, a duct, and/or a plenum. The air connection 140 may be air-tight using, for example, seals, gaskets, and/or threaded members. The air connection 140 may also have a shutter or back flow preventer to avoid undesirable flow through an opening when an air cooling system is removed.

The interface 160 may include a connection member, such as a seal, a gasket, a threaded member, a plate, planar member, or an aperture to receive the liquid connection 120 and the air connection 140. Moreover, the interface 160 may be a separate member or integrated into the electronic system, such as the top or side of a performance optimized data center (POD or EcoPOD). The interface 160 may be adapted for use with a liquid cooling system, an air cooling system, and/or both a liquid cooling system and an air cooling system. If only a liquid cooling system or an air cooling system are used, then a plug or other connection may be used to block the opening or portion of the interface 160 not in use.

The connection assembly 100 may further include additional connections such as a power connection 270 and/or a control connection 280. The power connection 270 to provide a power connection between the liquid cooling system, the air cooling system, and/or the electronic system. The connection assembly 100 may also include a control connection 280 to provide communication between the liquid cooling system, the air cooling system, and/or the electronic system. For example, the control connection 280 may provide control of input and output signals in addition to networking communication. The control connection 280 provides synchronization and communication between the electronic system and the liquid cooling system and the air cooling system, such as communication regarding the functionality components, the level of operation, the temperature of the electronic components, the temperature and/or humidity of the environment surrounding the electronic system and/or the cooling systems, and/or pressure of the air or liquid.

The connection assembly 100 may further include a mounting member 290 to provide a connection between the connection assembly 100 and the electronic system, the liquid cooling system, and/or the air cooling system. The mounting member 290 may include, for example, receptacles with pegs or retaining pins, or slot pins. The mounting member 290 provides the ability to adapt the connection assembly 100 to fit a variety of electronic systems, air cooling systems, and liquid cooling systems. Moreover, the mounting members 290 support the modularity and enables a variety of air cooling and liquid cooling systems to be used with the electronic systems. For example, the design may provide the ability to use off the shelf liquid cooling systems and air cooling systems that fit into the standardized connection assembly 100.

Figure 3:
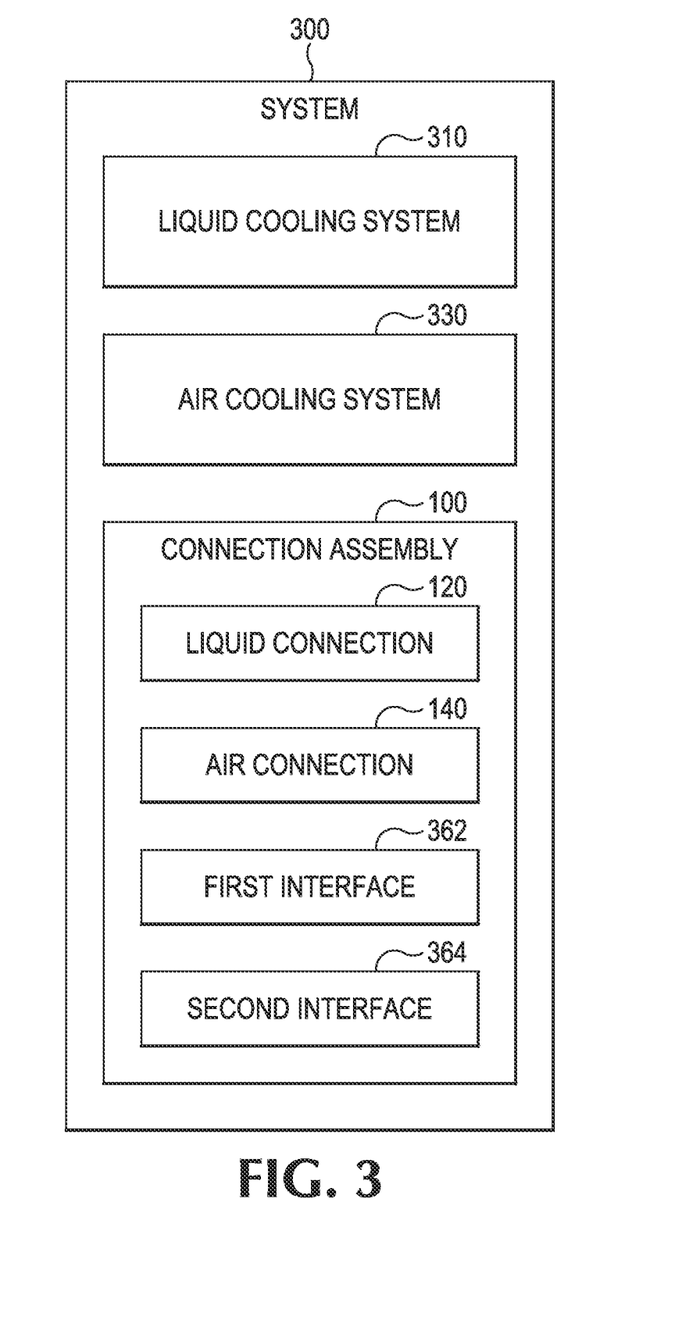
FIG. 3 illustrates a block diagram of a system to provide modular cooling of an electronic system according to an example.

FIG. 3 illustrates a block diagram of a system 300 to provide modular cooling of an electronic system according to an example. The system 300 includes a liquid cooling system 310, an air cooling system 330, and a connection assembly 100. The liquid cooling system 310 to cool the electronic system using liquid. The air cooling system 330 to cool the electronic system using air.

Figure 4:
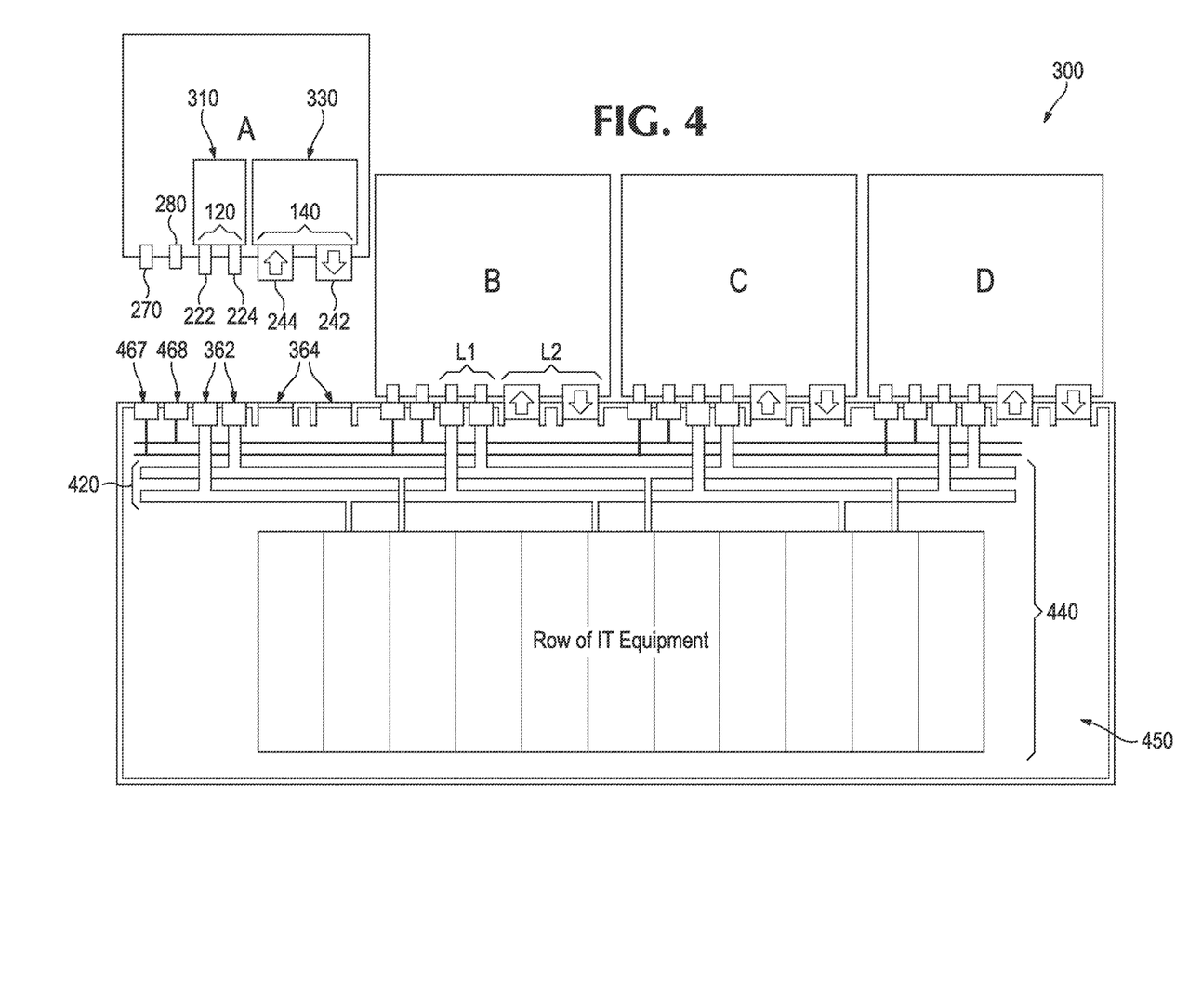
FIG. 4 illustrates a schematic diagram of the cooling system of FIG. 3 according to an example.

FIG. 4 illustrates a schematic diagram of the cooling system 300 of FIG. 3 according to an example. Referring to FIG. 4, four cooling modules are illustrated, A-D. Each of the cooling modules A-D are illustrated as including self-contained liquid and air supplies and a connection assembly 100. The connection assembly 100 includes a liquid connection 120 and an air connection 140. The liquid connection 120 and the air connection 140 may provide independent connections each at distinct locations. For example, the liquid connection 120 is positioned in a first location, L1, to connect to the liquid cooling system 310. The liquid connection 120 to provide a first interface 362 between the liquid cooling system 310 and an electronic system. For example, the liquid connection 120 connects to a liquid manifold 420 in the electronic system 450. The air connection 140 is positioned in a second location, L2, to connect to the air cooling system 330. The air connection 140 to provide a second interface 364 between the air cooling system 330 and the electronic system 450. For example, the air connection 140 connection to the electronic system to provide air to an air manifold 440 that distributes air within the electronic system 450. The air manifold 440 may include designated ducts or plenums within the electronic system or include the space between the electronic components 352 that receive the air.

The cooling system(s) may be selected based on the data center load and/or data center environment surrounding the data center. For example, the temperature or humidity of the data center or the environment surrounding the data center may be used to select the liquid cooling system 310 and/or the air cooling system 330 that would optimize power usage and cooling capabilities. Moreover, the modular design enables the variety of liquid cooling systems 310 and air cooling systems 330 to receive liquid and/or air from a separate connection, such as a supply above cooling system or through a self-contained air and/or liquid cooling system. Moreover, the modularity enables one portion of the liquid cooling system modules to receive liquid from a supply, but the other portion of the liquid cooling system modules to be self-contained. For example, if the electronic system 450 includes one set of electronic components densely packed and requiring a different temperature or volume liquid compared to another set of electronic components that are not as densely packed.

The first interface 362 to receive the liquid cooling system 310, and the second interface 364 to receive the air cooling system 330. For example, the first interface 362 is illustrated in FIG. 4 as a gasket or seal that may manually receive a tube, pipe, and/or valve. Similarly, the second interface 364 is illustrated in FIG. 4 as a gasket or seal that may receive a tube, a pipe, a duct, and/or a plenum to form a manual connection. Alternatives and variations in the design of the interface may also be used.

For example, the first interface 362 interchangeably receives a plurality of liquid cooling systems 310 selected from at least one of the following liquid cooling systems: an adiabatic liquid cooler, a "dry cooled" liquid device, an externally supplied coolant, a heat exchanger, an externally supplied cooling unit directly connected to electronic components, and a direct expansion liquid cooling device. The second interface 364 to interchangeably receive a plurality of air cooling systems 330 selected from at least one of the following air cooling systems: a direct expansion air cooling device, an adiabatic cooled device, an outside air induction device, a facility air cooler device, and a heat exchanger with facility chilled water. By using independent connections, the system may be designed to use a variety of liquid cooling systems 310 and air cooling systems 330 that may be interchanged or swapped out depending on the needs of the electronic system and/or environment surrounding the equipment.

The interfaces 160, i.e., the first interface 362 and the second interface 364 may be on the top of the electronic system 450, as illustrated below in FIG. 6 or it may be on a side or back of the electronic system 450 For example, the interface as illustrated in FIGS. 2 and 4 may be on the top, bottom, side, or back of the electronic system 450. The interface 160 to receive the liquid connection 120 and the air connection and/or an interface with the liquid connections 120 and the air connections 140 connected thereto.

Additional interfaces may be provided. For example, the connection assembly 100 may further include a power interface 457 connected to the power bus, i.e., power connection 270 to provide a power connection between the liquid cooling system 310 and the electronic system 450, and/or the air cooling system 310 and the electronic system 450. The connection assembly 100 may further include a control interface 468 connected to the control connection 280, such as a control bus, to provide communication between the liquid cooling system 310 and the electronic system 450, and/or the air cooling system 330 and the electronic system 450. For example, the control bus may provide communication that coordinates the liquid cooling system 310 and the air cooling system 330. For example, there may be a set of monitors to manage the temperature, power/electrical output, pressure, and/or functionality of the cooling system and/or the electronic system.

Moreover, the modular design makes installation of the cooling system easier and adjustable. For example, the components may be installed in modules as opposed to larger non-modular system. A fork lift or a small crane may be used instead of larger cranes or equipment. Additionally, the modular design allows for adjustments to the leak management and failure management components.

Figure 5:
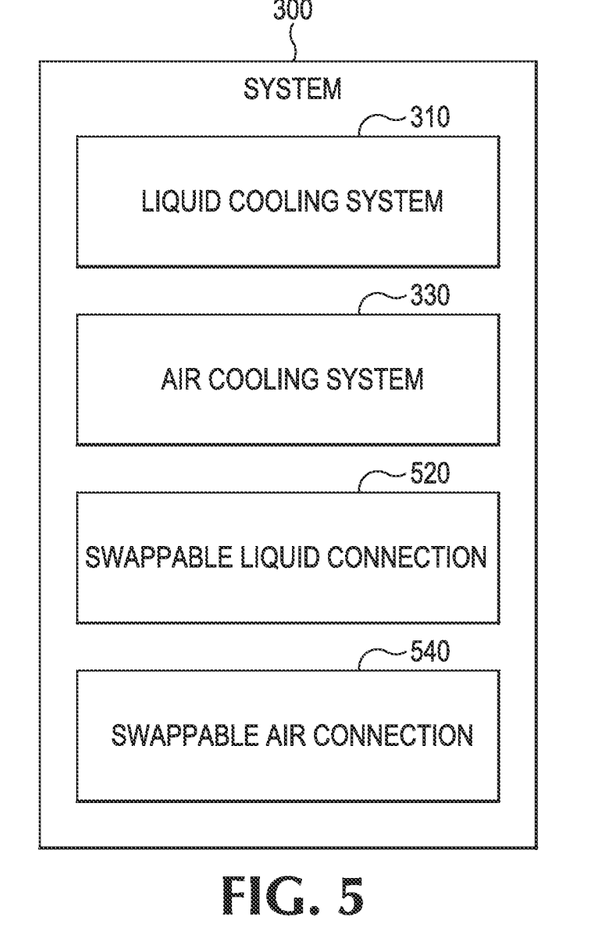
FIG. 5 illustrates a block diagram of a modular cooling system according to an example.

FIG. 5 illustrates a block diagram of a modular cooling system 300 according to an example. The modular cooling system 300 includes a liquid cooling system 310, an air cooling system 330, a swappable liquid connection 520, and a swappable air connection 540. The liquid cooling system 310 to cool the electronic system 450 using liquid. The air cooling system 330 to cool the electronic system 450 using air The swappable liquid connection 520 to provide a liquid connection that is compatible with a plurality of liquid cooling systems 310. The swappable liquid connection 520 to mate the liquid cooling system 310 with the electronic system 450. For example, the swappable liquid connection 520, may include a blind mate connector to mate with a liquid connection on a liquid cooling system. Alternatively, the connection may be manually formed using a tube, pipe, and/or valve that is manually inserted therein.

The swappable air connection 540 to provide an air connection that is compatible with a plurality of air cooling systems 330. The swappable air connection 540 to mate the air cooling system 330 with the electronic system 450. The air connection 140 may include a blind mate connection that requires the connection be made by putting two objects together. Alternatively, a mechanical connection may be used with a manual connection step and/or a lever or other mechanism that requires the user to make the connection by positioning two objects and then connecting them through an additional step. The use of blind mate connectors versus mechanical connections depend on the design of the electronic system 450 and/or the air cooling system 330. Moreover, the swappable liquid connection 520 and the swappable air connection may provide hot swappable connections to the liquid cooling system 310 and the air cooling system 330. The hat swappable connections enable the cooling systems to be interchangeable without making changes to the electronic system. For example, the cooling system may be swapped out to be repaired, maintained, and/or replaced.

Figure 6:
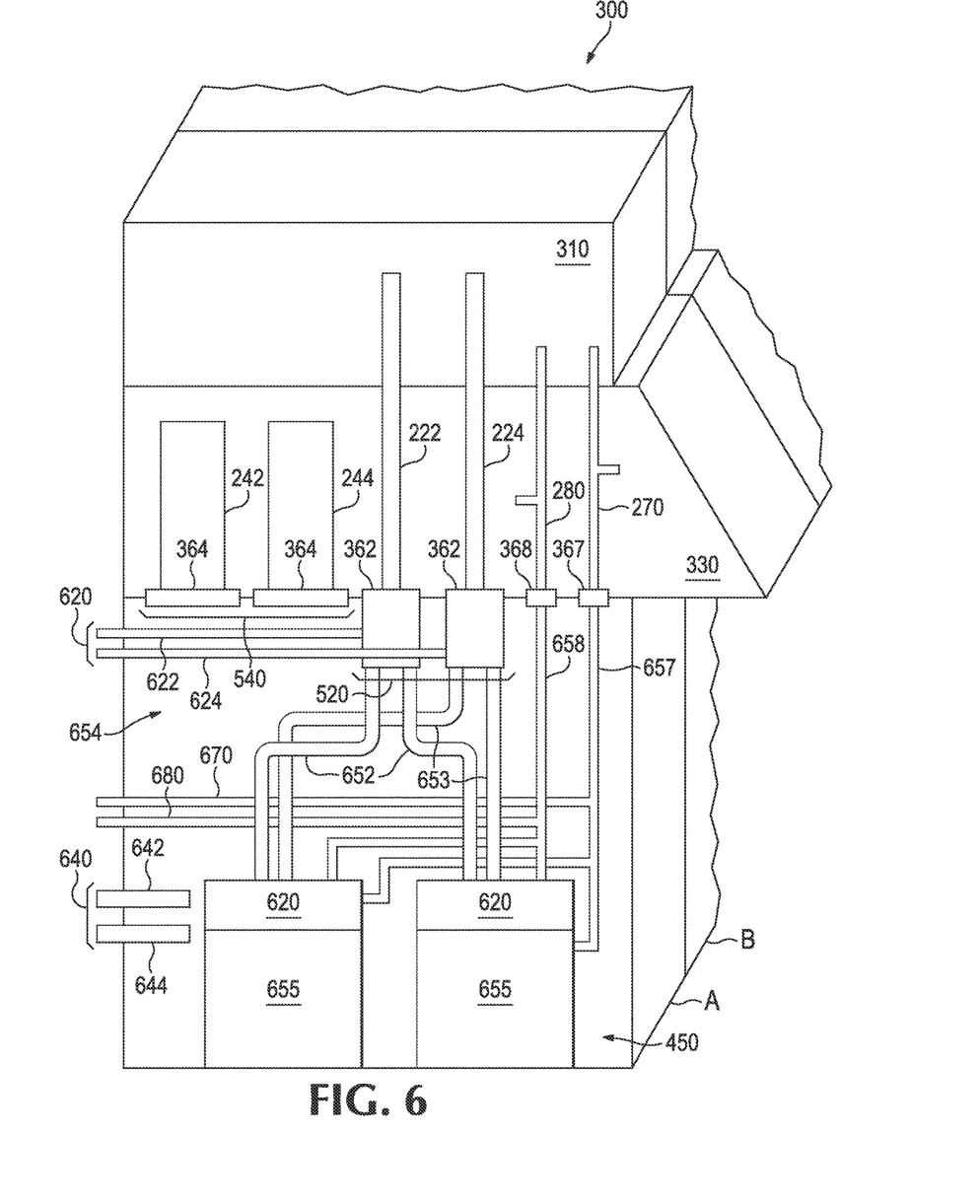
FIG. 6 illustrates a cross-sectional view of the modular cooling system of FIG. 5 according to an example.

FIG. 6 illustrates a cross-sectional view of the modular cooling system 300 of FIG. 5 according to an example. The modular cooling system 300 includes a liquid cooling system 310 illustrated as including a liquid supply 222 and a liquid return 224. The swappable liquid connection 520 may include the first interface 32 illustrated as a blind mate connector that mates with, for example, a tube, a pipe, a valve, a gasket, and/or a seal located on the liquid cooling system 310, such as the liquid supply 222 and the liquid return 224. The blind mate connector may further connect the liquid cooling system 310 to the electronic system 450 via a tube, a pipe, or a valve 652, 653 connected to the blind mate connector. The swappable liquid connection 520 may alternatively include a manual connection as discussed above, depending on the design.

The liquid cooling system 310 is illustrated as including a liquid source 620 to provide liquid to and receive liquid from the electronic system 450. The liquid source 620 may connect to a facility to provide an override and/or backup liquid supply and liquid return in case of a fault or need for an override. The liquid source 620 includes a supply line 622 and a return line 624.

The air cooling system 330 is illustrated as including an air supply 242 and an air return 244. The swappable air connection 540 may include a second interface 364 illustrated as a blind mate connector. For example, the air supply 242 and the air return 244 may include a tube, a pipe, a duct, and/or a plenum that connects the blind mate connector to the air cooling system 330. The air from the air cooling system 330 to be circulated through the electronic system using the space 654 around the electronic components 655. The swappable air connection 540 may alternatively include a manual connection as discussed above, depending on the design.

The air cooling system 330 is illustrated as including an air source 640 to provide air to and receive air from the electronic system 450. The air source 640 may connect to a facility to provide an override and/or backup system that uses the air supply line 642 and the air return line 644 to distribute the air when there is a fault or an override is needed.

The electronic system 450 is illustrated as, for example, a performance optimized data center (POD or EcoPOD). The electronic system 450 may including electronic components 652, such as high density servers. The electronic components 652 are illustrated as being cooled using the liquid cooling system 310 and the air cooling system 330. The liquid cooling system 310 is connected to the electronic components 652 via pipes or tubes that transport the liquid along the liquid supply 222 to the cold plates 620. The liquid may be transported various ways, the interface connection provides a standardized position for the liquid to be provided or adapted to be provided to the electronic system 450 to enable use of the diverse liquid cooling systems. The cold plates 620 may be used to remove the heat from the electronic components 652. As the heat is removed from the electronic components 655, the heat is transferred to the liquid and the liquid is returned to the liquid cooling system 310 via the liquid return 224.

The air cooling system 330 is connected to the electronic components 652 via the tube pipe, duct or plenum that transport the air to the electronic components 652 and remove the air from the electronic system 450. For example, the air may be provided through air manifolds. The air supply 242 and the air return 244 each provide a swappable air connection 540 to form the connection between the air cooling system and the electronic system and enables the transfer of the air therethrough.

Referring to FIG. 6, a power connection 270 and a control connection 280 are further illustrated. The power connection 270 is illustrated as a power bus that provides power to the liquid cooling system 310 and air cooling system 330. The power bus may include a power interface 467 that connects the power bus to a power line 657 within the electronic system 450. A power source 670 is also illustrated to connect to a facility and provide additional power and/or backup power.

The control connection 280 is illustrated as a control bus that provide communication between the liquid cooling system 310, the air cooling system 330, and the electronic system 450. The control bus may include a control interface 468 that connects the control bus to a control line 658 within the electronic system 450. A control source 680 is further illustrated to connect to a facility and provide an additional control signal for backup control, overrides, and/or additional communication options with the facility.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A connection assembly usable with a modular cooling system, the connection assembly comprising:
    a liquid connection to connect to a corresponding liquid connection of an electronic system, the liquid connection positioned in a first location of the connection assembly to receive a liquid cooling system to directly cool the electronic system by liquid passing from the liquid cooling system through the liquid connection of the connection assembly and through the corresponding liquid connection of the electronic system to the electronic system; and
    an air connection to connect to a corresponding air connection of the electronic system, the air connection positioned in a second location of the connection assembly to receive an air cooling system to directly cool the electronic system, separately from the liquid cooling system cooling the electronic system, by air passing from the air cooling system through the air connection of the connection assembly and through the corresponding air connection of the electronic system to the electronic system,
    the liquid connection and the air connection to provide an interface of the connection assembly between the electronic system and the liquid cooling system and between the electronic system and the air cooling system by which the liquid cooling system and the air cooling system are connected to the electronic system to permit the liquid cooling system and the air cooling system to directly and separately cool the electronic system, wherein the interface is independent of the liquid cooling system and the air cooling system.

2. The connection assembly of claim 1, wherein the air connection comprises an air supply and an air return.

3. The connection assembly of claim 1, wherein the liquid connection comprises a liquid supply and a liquid return.

4. The connection assembly of claim 1, wherein the liquid connection comprises a blind mate connection.

5. The connection assembly of claim 1, wherein the liquid connection comprises at least one connector selected from the following connectors a cable, a hose, and a valve.

6. The connection assembly of claim 1, further comprising a control connection.

7. The connection assembly of claim 1, further comprising a power connection.

8. The connection assembly of claim 1, further comprising a mounting member to attach the assembly to the electronic system.

9. A system to provide modular cooling of an electronic system comprising:
    a liquid cooling system to directly cool the electronic system;
    an air cooling system to directly cool the electronic system separately from the liquid cooling system cooling the electronic system; and
    a connection assembly including:
        a liquid connection positioned in a first location of the connection assembly to connect to the liquid cooling system and to a corresponding liquid connection of an electronic system, the liquid connection to provide a first interface between the liquid cooling system and the electronic system to directly cool the electronic system by liquid passing from the liquid cooling system through the liquid connection of the connection assembly and through the corresponding liquid connection of the electronic system to the electronic system; and
        an air connection positioned in a second location of the connection assembly to connect to the air cooling system and to a corresponding air connection of the electronic system, the air connection to provide a second interface between the air cooling system and the electronic system to directly cool the electronic system by air passing from the air cooling system through the air connection of the connection assembly and through the corresponding air connection of the electronic system to the electronic system, wherein the liquid connection and the air connection provide an interface of the connection assembly by which the liquid cooling system and the air cooling system are connected to the electronic system to permit the liquid cooling system and the air cooling system to directly and separately cool the electronic system.

10. The system of claim 9, wherein the first interface interchangeably receives a plurality of liquid cooling systems selected from at least one of the following liquid cooling systems an adiabatic liquid cooler, a "dry cooled" liquid device, an externally supplied coolant, a heat exchanger, an externally supplied cooling unit directly connected to electronic components, and a direct expansion liquid cooling device.

11. The system of claim 9, wherein the second interface to interchangeably receive a plurality of air cooling systems selected from at least one of the following air cooling systems a direct expansion air cooling device, an adiabatic cooled device, an outside air induction device, a facility air cooler device, and a heat exchanger with facility chilled water.

12. The system of claim 9, wherein the connection assembly further comprises a power bus.

13. The system of claim 9, wherein the connection assembly further comprises a control bus.

14. A modular cooling system comprising:
a liquid cooling system to directly cool an electronic system;
an air cooling system to directly cool the electronic system separately from the liquid cooling system;
a swappable liquid connection to connect to the electronic system, the swappable liquid connection positioned in a first location of a connection assembly to provide a liquid connection compatible with a plurality of liquid cooling systems, the swappable liquid connection to connect to a corresponding liquid connection of the electronic system, the swappable liquid connection to mate the liquid cooling system with the electronic system to directly cool the electronic system by liquid passing from the liquid cooling system through the liquid connection of the connection assembly and through the corresponding liquid connection of the electronic system to the electronic system; and
a swappable air connection to connect to the electronic system, the swappable air connection positioned in a second location of the connection assembly to provide an air connection compatible with a plurality of air cooling systems, the swappable air connection to connect to a corresponding air connection of the electronic system, the swappable air connection to mate the air cooling system with the electronic system to directly cool the electronic system by air passing from the air cooling system through the air connection of the connection assembly and through the corresponding air connection of the electronic system to the electronic system,
wherein the liquid connection and the air connection provide an interface of the connection assembly by which the liquid cooling system and the air cooling system are connected to the electronic system to permit the liquid cooling system and the air cooling system to directly and separately cool the electronic system.

15. The modular cooling system of claim 14, wherein the swappable liquid connection and the swappable air connection provide independent connections.

* * * * *